United States Patent
Nomura

(10) Patent No.: US 9,400,211 B2
(45) Date of Patent: Jul. 26, 2016

(54) OPTICAL POWER MONITORING DEVICE, METHOD, AND PROGRAM

(75) Inventor: Rintaro Nomura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 322 days.

(21) Appl. No.: 14/344,493

(22) PCT Filed: Sep. 11, 2012

(86) PCT No.: PCT/JP2012/073209
§ 371 (c)(1),
(2), (4) Date: Mar. 12, 2014

(87) PCT Pub. No.: WO2013/042583
PCT Pub. Date: Mar. 28, 2013

(65) Prior Publication Data
US 2014/0361151 A1    Dec. 11, 2014

(30) Foreign Application Priority Data

Sep. 22, 2011  (JP) .................................. 2011-206783

(51) Int. Cl.
*G01J 1/44* (2006.01)
*H03F 3/08* (2006.01)
*G01K 13/00* (2006.01)

(52) U.S. Cl.
CPC . *G01J 1/44* (2013.01); *G01K 13/00* (2013.01); *H03F 3/087* (2013.01); *G01J 2001/4466* (2013.01)

(58) Field of Classification Search
CPC .... G01J 1/44; G01J 2001/4466; G01K 13/00; H03F 3/087

USPC ................................. 250/214 R; 398/38, 120
See application file for complete search history.

(56) References Cited

U.S. PATENT DOCUMENTS

2009/0238582 A1    9/2009  Tsunoda et al.

FOREIGN PATENT DOCUMENTS

| CN | 1717446 A | 1/2006 |
|---|---|---|
| JP | 11-234054 A | 8/1999 |
| JP | H11-234061 A | 8/1999 |
| JP | 2002-84235 A | 3/2002 |
| JP | 2004-32003 A | 1/2004 |
| JP | 2004-289206 A | 10/2004 |
| JP | 2005-121367 A | 5/2005 |
| JP | 2007-243510 A | 9/2007 |

(Continued)

OTHER PUBLICATIONS

Chinese Office Action for CN Application No. 201280046178.9 issued on Jan. 25, 2016 with English Translation.

(Continued)

*Primary Examiner* — Renee D Chavez

(57) ABSTRACT

An optical power monitoring device is provided with: an APD as a photodiode that converts the power of light to a current (Iapd); a resistor that is connected in parallel to the APD; a current mirror circuit that detects, as a first current value (I1), the value corresponding to the sum of the current (Irb) flowing through the resistor and the current (Iapd) flowing through the APD; and a control unit. The control unit stores in advance a value corresponding to the current flowing through the resistor as a second current value (I2), and determines the current (Iapd) flowing through the APD on the basis of the second current value (I2) and the first current value (I1) detected by the current mirror circuit.

10 Claims, 5 Drawing Sheets

(56) References Cited

FOREIGN PATENT DOCUMENTS

| | | |
|---|---|---|
| JP | 2011-40814 A | 2/2011 |
| WO | 2008/099507 A1 | 8/2008 |

OTHER PUBLICATIONS

International Search Report for PCT Application No. PCT/JP2012/073209, mailed on Oct. 9, 2012.

Japanese Office Action for JP Application No. 2013-534669 mailed on Sep. 24, 2014 with Partial English Translation.

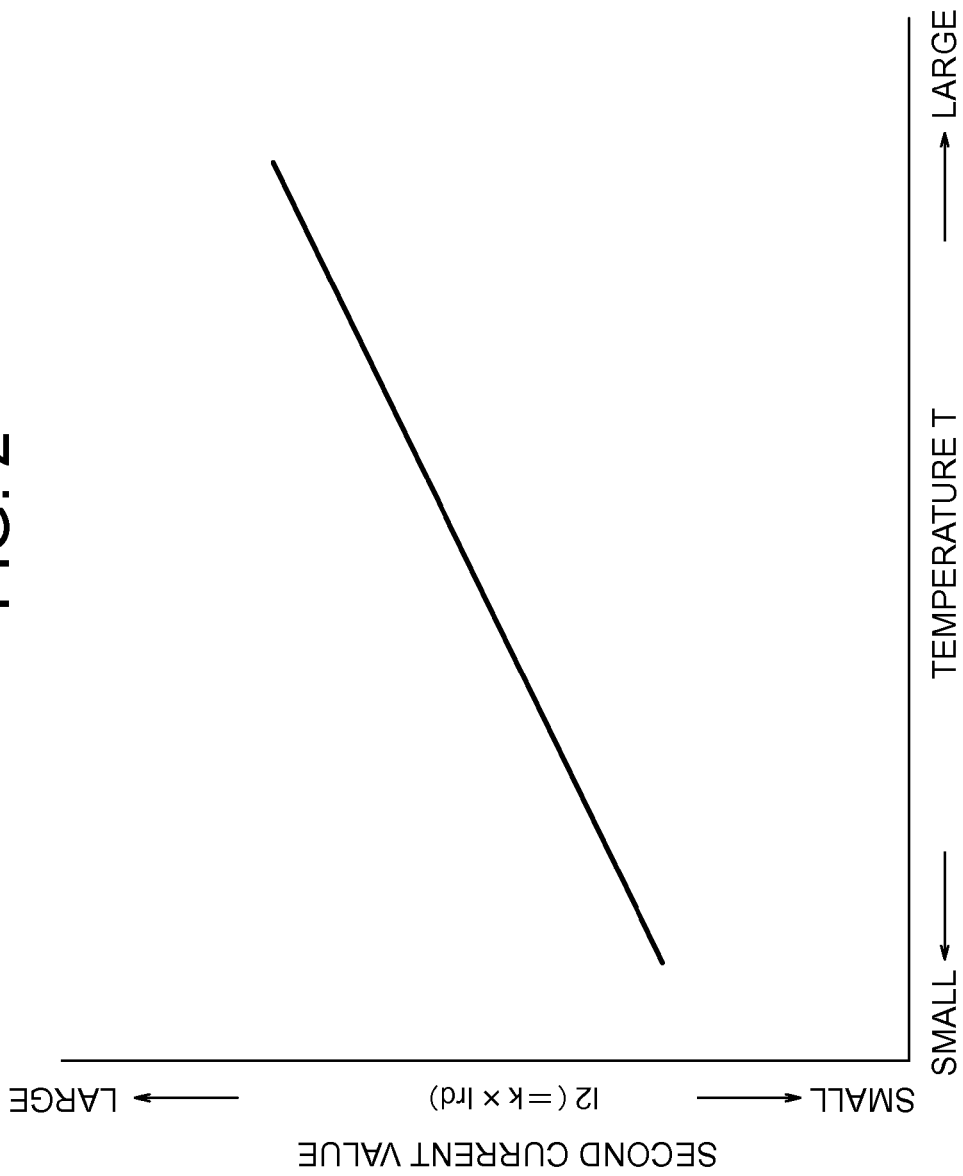

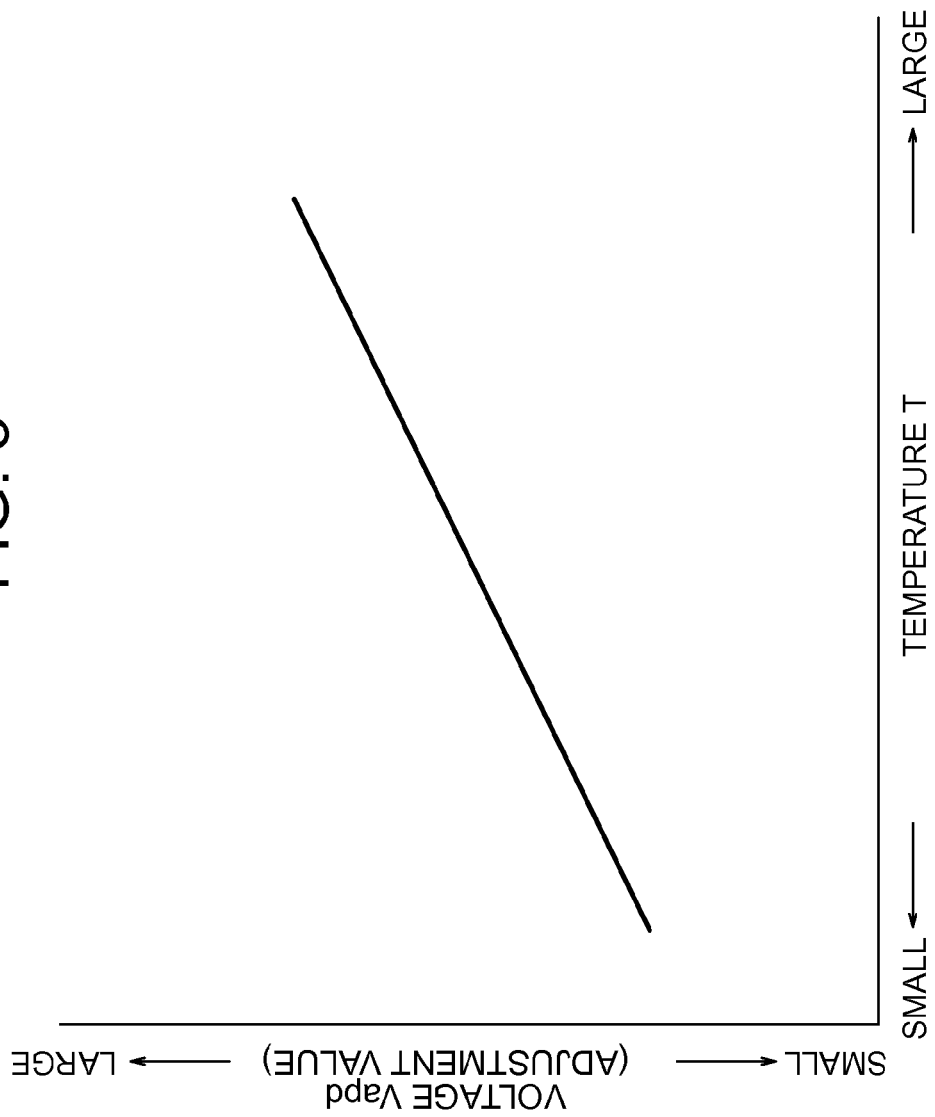

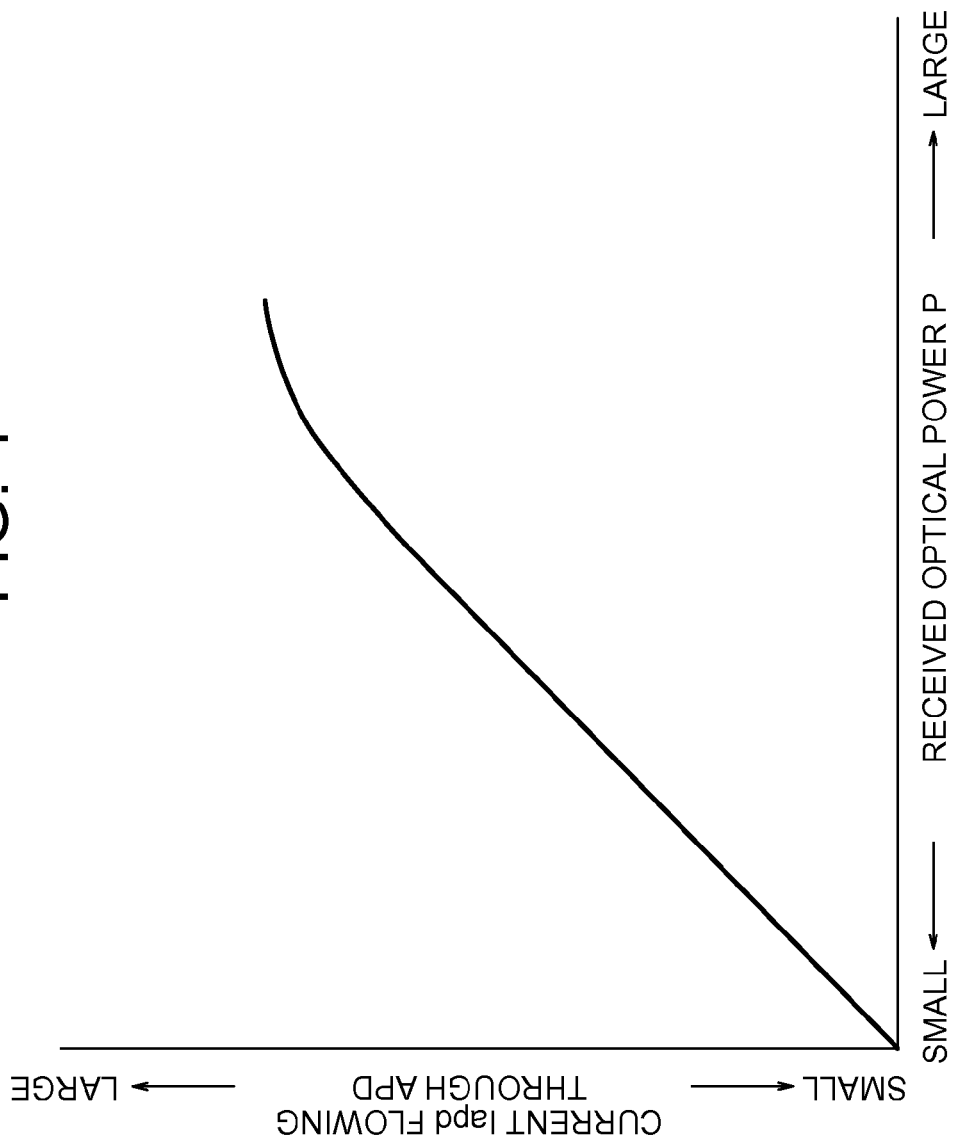

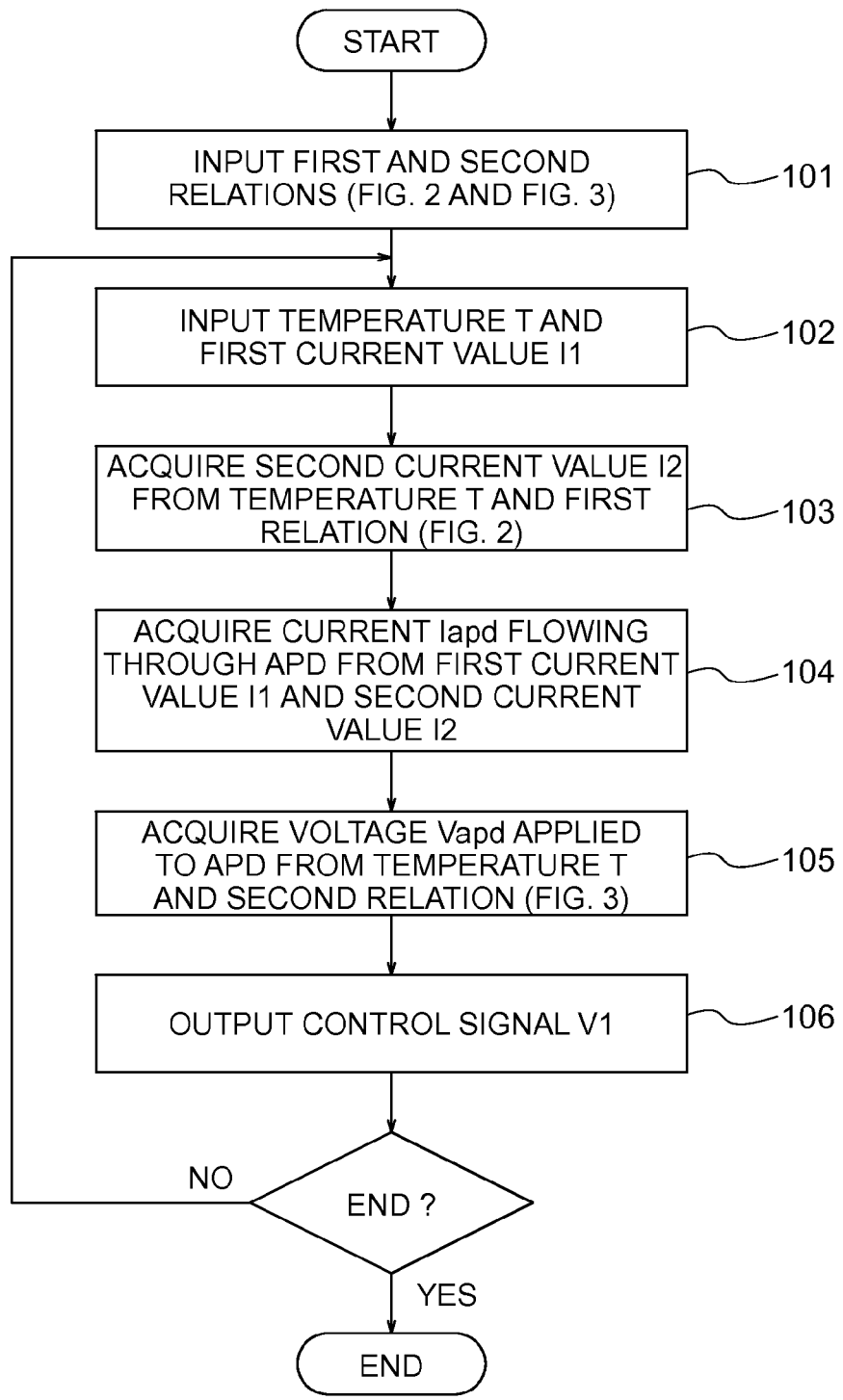

OPTICAL POWER MONITORING DEVICE, METHOD, AND PROGRAM

This application is a National Stage Entry of PCT/JP2012/073209 filed on Sep. 11, 2012, which claims priority from Japanese Patent Application 2011-206783 filed on Sep. 22, 2011, the contents of all of which are incorporated herein by reference, in their entirety.

TECHNICAL FIELD

The present invention relates to an optical power monitoring device used for optical communications and the like. More specifically, the present invention relates to an optical power monitoring device that has a feature in its offset correction circuit. Hereinafter, an avalanche photo diode is abbreviated as "APD".

BACKGROUND ART

As the related techniques of the optical power monitoring device using APD, Patent Documents 1 and 2 shown below will be described.

Patent Document 1 discloses an APD bias voltage control circuit. This APD bias voltage control circuit is constituted with: a light receiving unit which receives an optical signal by an APD and converts it to an electric signal; and an APD bias voltage control unit which gives an optimum bias voltage to the APD. The APD bias voltage control unit is constituted with: a direct current voltage source which is capable of controlling an output voltage; a variable resistor connected between the direct current voltage source and the APD; and a CPU which performs various kinds of controls. The variable resistor is connected in series to the APD and gives a bias voltage to the APD.

Patent Document 2 discloses a light receiver which uses an APD as a light receiving element. This light receiver calculates the magnification corresponding to the intensity of an inputted optical signal of the APD and divides a value acquired by simply converting an APD current to a voltage with that value to linearize the relation between the intensity of the inputted optical signal and the voltage of the inputted optical signal.

Patent Document 1: Japanese Unexamined Patent Publication 2002-084235 (ABSTRACT, FIG. 4, and the like)
Patent Document 2: Japanese Unexamined Patent Publication 2004-289206 (ABSTRACT, FIG. 1, and the like)

As described above, the optical power monitoring device using the APD is broadly used in the fields of optical communications and the like. Further, it is desired to achieve higher speed and higher precision with the optical power monitoring device.

It is therefore an object of the present invention to provide an optical power monitoring device and the like capable of further achieving the speed and precision further, which is the issue described above.

DISCLOSURE OF THE INVENTION

The optical power monitoring device according to the present invention is a device which includes: a photodiode which converts a received optical power to a current; a resistor connected in parallel to the photodiode; a current mirror circuit which detects a value corresponding to a sum of a current flowing through the resistor and a current flowing through the photodiode as a first current value; and a control unit which stores in advance a value corresponding to the current flowing through the resistor as a second current value, and acquires the current flowing through the photodiode based on the second current value and the first current value that is detected by the current mirror circuit.

The optical power monitoring method according to the present invention is a method used in a device including a photodiode which converts a received optical power to a current, a resistor connected in parallel to the photodiode, and a current mirror circuit which detects a value corresponding to a sum of a current flowing through the resistor and a current flowing through the photodiode as a first current value, and the method includes: storing in advance a value corresponding to the current flowing through the resistor as a second current value; and acquiring the current flowing through the photodiode based on the second current value and the first current value that is detected by the current mirror circuit.

The optical power monitoring program according to the present invention is a program used in a device including a photodiode which converts a received optical power to a current, a resistor connected in parallel to the photodiode, a current mirror circuit which detects a value corresponding to a sum of a current flowing through the resistor and a current flowing through the photodiode as a first current value, memory, and a microprocessor, wherein the memory stores in advance a value corresponding to the current flowing through the resistor as a second current value, and the program causes the microprocessor to execute: a function which inputs the second current value stored in the memory and the first current value detected by the current mirror circuit; and a function which acquires the current flowing through the photodiode based on the inputted second current value and the first current value.

The present invention makes it possible to improve the response speed of the current mirror circuit through connecting the resistor in parallel to the photodiode and to acquire the current flowing through the photodiode accurately through storing in advance the current flowing through the resistor. Therefore, with the present invention, it is possible to further improve the speed and the precision of the optical power monitor.

BRIEF DESCRIPTION OF THE DRAWINGS

FIG. 2 is a graph showing a relation (first relation) between the temperature of an APD and the current flowing through a resistor for bias according to the exemplary embodiment;

FIG. 3 is a graph showing a relation (second relation) between the temperature of the APD and the applied voltage of the APD according to the exemplary embodiment;

FIG. 4 is a graph showing a relation between the power received by the APD and the current flowing through the APD according to the exemplary embodiment; and FIG. 5 is a flowchart showing an example of the operations of a computer executed by using an optical power monitoring program according to an exemplary embodiment of the present invention.

BEST MODES FOR CARRYING OUT THE INVENTION

Figure 1:
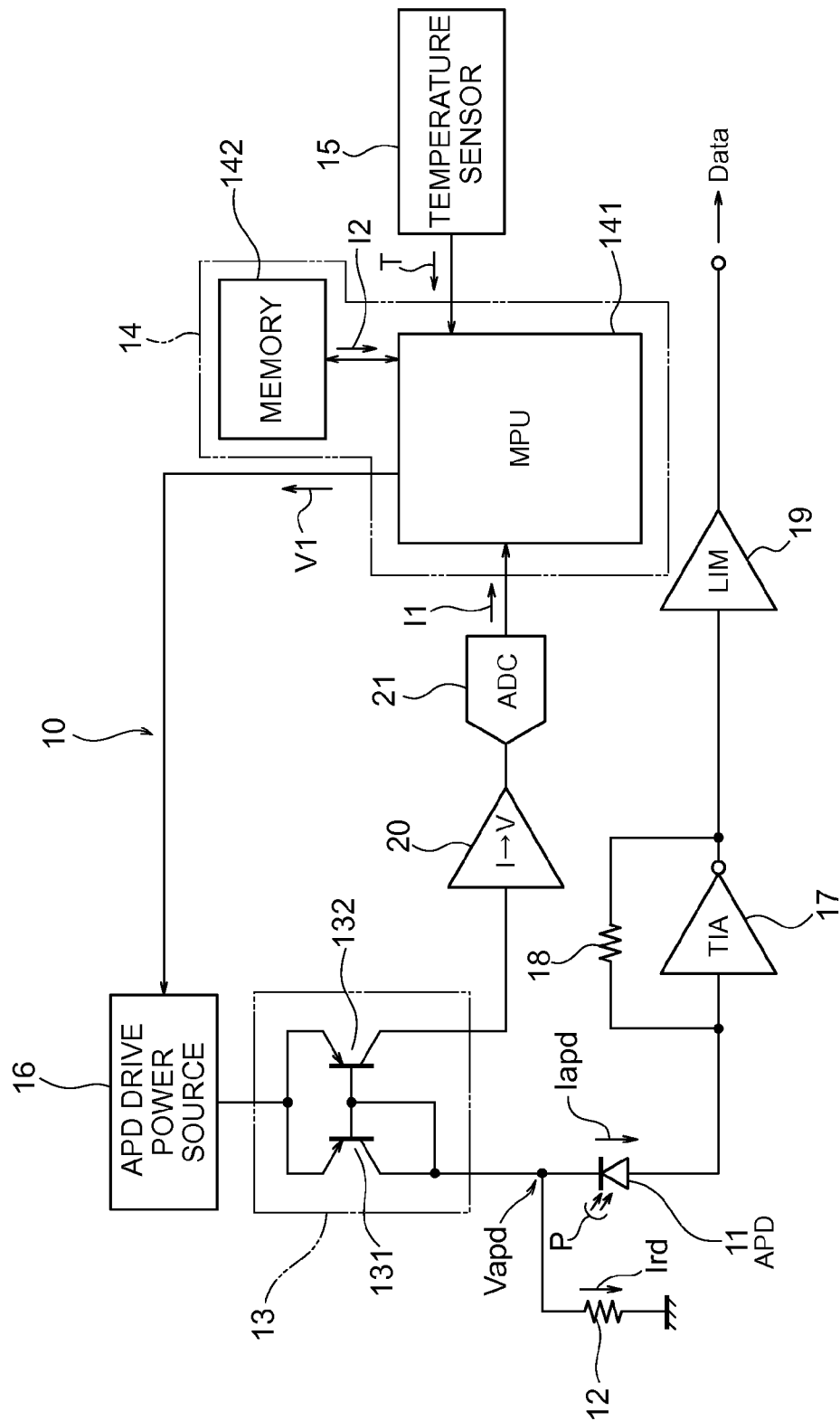
FIG. 1 is a circuit diagram showing an optical power monitoring device according to an exemplary embodiment of the present invention.

FIG. 1 is a circuit diagram showing an optical power monitoring device according to an exemplary embodiment of the present invention. Hereinafter, explanations will be provided by mainly referring to FIG. 1 and also referring to the graphs of FIG. 2 to FIG. 4.

An optical power monitoring device 10 according to the exemplary embodiment includes: an APD 11 as a photodiode which converts a received optical power P into a current Iapd; a resistor 12 connected in parallel to the APD 11; a current mirror circuit 13 which detects a value corresponding to the sum of a current Irb flowing through the resistor 12 and the current Iapd flowing through the APD 11 as a first current value I1; and a control unit 14. The control unit 14 stores in advance a value corresponding to the current flowing through the resistor 12 as a second current value I2, and acquires the current Iapd flowing through the APD 11 based on the second current value I2 and the first current value I1 detected by the current mirror circuit 13. For example, assuming that k is a constant, the first current value I1 is expressed as k×(Irb+Iapd), and the second current value I2 is expressed as k×Irb.

With the exemplary embodiment, it is possible to shorten the time that is required for starting up the current mirror circuit 13 by continuously supplying the constant current Irb flown to the resistor 12. Thus, the response speed of the current mirror circuit 13 can be improved. In addition, it is possible with the exemplary embodiment to accurately acquire the current Iapd flowing through the APD 11 by storing in advance the second current value I2. In other words, the exemplary embodiment makes it possible to improve the response speed of the current mirror circuit 13 by connecting the resistor 12 in parallel to the APD 11 and to accurately acquire the current Iapd flowing through the APD 11 by storing in advance the current Irb flowing through the resistor 12, so that the speed and the precision of the optical power monitor can be improved further.

The APD 11 exhibits such temperature characteristic that the magnification decreases when the temperature increases at the time of applying a specific reverse bias voltage. This is because oscillation of crystal lattices becomes intense when the temperature increases so that the frequency of the collision of accelerated carriers is increased. In a case where the temperature of the APD 11 is controlled as constant or a case where the changes in the temperature of the APD 11 can be ignored, the above-described structures may be employed. In such case, the second current value I2 takes a single value. However, as will be described later, the output of the APD 11 may be stabilized as well through changing the applied voltage of the APD 11 in accordance with the changes in the temperature of the APD 11. In that case, the second current value I2 takes a plurality of values.

That is, the optical power monitoring device 10 according to the exemplary embodiment further includes a temperature sensor 15 which detects the temperature T of the APD 11. At this time, the control unit 14 stores in advance the relation between the temperature T detected by the temperature sensor 15 and the second current value I2 as a first relation (FIG. 2), acquires the second current value I2 corresponding to the temperature T detected by the temperature sensor 15 from the first relation (FIG. 2), and acquires the current Iapd flowing through the APD 11 by using the second current value I2.

Further, the optical power monitoring device 10 according to the exemplary embodiment further includes an APD drive power source 16 as a power source which applies a voltage Vapd to the APD 11 and the resistor 12 and changes the voltage Vapd according to a control signal V1 from the control unit 14. At this time, the control unit 14 stores in advance the relation between the temperature T detected by the temperature sensor 15 and the voltage Vapd applied to the APD 11 as a second relation (FIG. 3), acquires the voltage Vapd corresponding to the temperature T detected by the temperature sensor 15 from the second relation (FIG. 3), and outputs the control signal V1 to the APD drive power source 16 so as to output the voltage Vapd. At this time, in the first relation (FIG. 2), the change in the second current value I2 when the voltage Vapd is changed by corresponding to the temperature T detected by the temperature sensor 15 is added.

For example, when the temperature T of the APD 11 decreases, the magnification of the APD 11 decreases. Thus, the voltage Vapd to be applied is increased (FIG. 3). Accordingly, the voltage Vapd applied to the resistor 12 is increased as well, so that the current Irb flowing through the resistor 12 is also increased. That is, increase in the temperature T→increase in the voltage Vapd→increase in the current Irb, so that the temperature T and the current Irb is in a one-on-one relation (FIG. 2).

Each of the structural elements will be described. The resistor 12 applies the bias voltage to the APD 11. One end thereof is connected to a cathode of the APD 11, and the other is earthed. Thereby, the drop voltage thereof is applied to the APD 11. The current mirror circuit 13 is a typical type which is constituted with P-channel bipolar type transistors 131 and 132. The transistors 131 and 132 both have a same characteristic with each other, and emitters as well as bases thereof are connected to each other. The base and the collector of the transmitter 131 are connected. The control unit 14 is a computer which includes an MPU (Micro Processing Unit) 141 and a memory 142. The temperature sensor 15 directly or indirectly detects the temperature of the APD 11. The APD drive power source 16 is a typical direct current voltage power source, which is capable of changing the output voltage by a computer or the like. As the photodiode, it is also possible to use a PIN photodiode or the like instead of the APD 11.

Hereinafter, the exemplary embodiment will be described in more details.

The optical power monitoring device 10 according to the exemplary embodiment can also be called as an optical module having a receiving function, and includes a TIA (Trans-Impedance Amplifier) 17, a resistor 18, an LIM (LIMiting Amplifier) 19, a current-voltage converter circuit 20, and an AD (Analog to Digital) converter 21 in addition to the APD 11, the resistor 12, the current mirror circuit 13, the MPU 141, the memory 142, the temperature sensor 15, and the APD driver power source 16. The resistor 18 is connected between the input and the output of the TIA 17. The TIA 17, the resistor 18, and the LIM 19 are provided on the anode side of the APD 11, and the current-voltage converter circuit 20 and the AD converter 21 are provided between the current mirror circuit 13 and the MPU 141. The resistor 12 for bias is used for speeding up the response of the current mirror circuit 13.

Here, the received optical power P is converted into the current Iapd by the APD 11. The current mirror circuit 13 outputs the current proportional to the sum of the current Iapd flowing through the APD 11 and the current Irb flowing through the resistor 12 to the current-voltage converter circuit 20. The current-voltage converter circuit 20 converts the current to a voltage, and outputs it to the AD converter 21. The AD converter 21 converts the voltage to a digital value, and gives it to the MPU 141 as the first current value I1.

The MPU 141 keeps in advance the second current value I2 corresponding to the current Irb flowing through the resistor 12 in the memory 142. Thus, the MPU 141 can detect only the current Iapd flowing through the APD 11 by finding a difference between the first current value I1 that is the read-out value of the AD converter 21 and the above-described second current value I2. Since there is a correlation between the current Iapd flowing through the APD 11 and the received optical power P (FIG. 4), it is possible to restore the received optical power P with high precision through storing in advance the relation in the memory 142. That is, it is possible to measure the received optical power P inputted by the APD 11 with high precision through storing in advance the second current value I2 corresponding to the current Irb flowing through the resistor 12 in the memory 142.

As described, while employing the resistor 12 for bias as a simple and low-cost means for speeding up the response of the current mirror circuit 13, the exemplary embodiment is capable of improving the accuracy of the received optical power monitor through correcting the offset by the current Irb flowing through the resistor 12 which is the shortcoming of employing that. In other words, the offset correction circuit of the optical power monitor according to the exemplary embodiment is a circuit which can easily correct the offset that is generated when measuring the received optical power P in the optical module having the receiving function using the APD 11.

Next, operations of the optical power monitoring device 10 according to the exemplary embodiment will be described in more details.

In the structure of FIG. 1, the received optical power P is converted into the current Iapd by the APD 11. As shown in FIG. 4, there is a positive correlation between the received optical power P and the current Iapd flowing through the APD 11. Thus, through acquiring the current Iapd flowing through the APD 11, the received optical power P can be estimated. In the meantime, the resistor 12 for bias is used for increasing the response speed of the current mirror circuit 13. That is, the instant responsiveness of the current mirror circuit 13 can be improved through supplying the current Irb flown to the current mirror circuit 13 in a fixed manner by using the resistor 12. Assuming that the resistance value of the resistor 12 is Rb, the current Irb flowing through the resistor 12 can be expressed as Vapd/Rb. The voltage Vapd is a reverse bias voltage applied to the APD 11, and it is supplied from the APD drive power source 16.

The positive correlation between the received optical power P and the current Iapd flowing through the APD 11 exhibits such a characteristic that it fluctuates depending on the temperature T of the surroundings of the APD 11. Thus, in order to keep the correlation constant, it is necessary to change the voltage Vapd according to the temperature T of the surroundings as shown in FIG. 3. In the structure of FIG. 1, the MPU 141 controls the voltage Vapd outputted from the APD drive power source 16 according to the temperature T. At that time, when the voltage Vapd fluctuates depending on the temperature T, the current Irb (=Vapd/Rb) flowing through the resistor 12 fluctuates as well depending on the temperature T.

The current mirror circuit 13 outputs the current that is proportional to the sum of the current Iapd flowing through the APD 11 and the current Irb flowing through the resistor 12. The outputted current is converted into a voltage by the current-voltage converter circuit 20 and inputted to the AD converter 21. At last, "k×(Iapd+Irb)" that is acquired by multiplying the constant k determined in the entire circuits of the current mirror circuit 13, the current-voltage converter circuit 20, and the AD converter 21 thereto is captured into the MPU 141 as the first current value I1.

FIG. 2 is a graph showing the relation between the temperature T and the second current value I2 (=k×Irb). This relation is saved in advance in the memory 142 as the first relation. Thereby, the MPU 141 can extract only the current (=k×Iapd) for the received optical power by reading out the second current value I2 corresponding to the temperature T detected by the temperature sensor 15 from the memory 142 and finding a difference thereof with respect to the first current value I1 (k×(Irb+Iapd)) inputted from the AD converter 21. As shown in FIG. 4, there is a positive correlation between the current Iapd and the received optical power P, so that the received optical power P can be acquired by acquiring k×Iapd.

In the meantime, the received optical power P inputted by the APD 11 is demodulated to an electric signal Data by the TIA 17 and the LIM 19. This is the basic function of the optical module, and there is no direct relation between that and the exemplary embodiment.

As described, the exemplary embodiment makes it possible to measure the current Iapd flowing through the APD 11, i.e., only the received optical power P, through correcting the offset fluctuation generated by the current Irb flowing through the resistor 12.

Next, the effects of the exemplary embodiment will be described.

The first effect of the exemplary embodiment is that it is possible to improve the accuracy of the received optical power monitor through correcting the offset caused by the current flowing through the resistor 12. The second effect of the exemplary embodiment is that it is possible to use a low-cost and small fixed resistor (resistor 12) as the current source for improving the responsiveness of the current mirror circuit 13.

Next, the optical power monitoring method according to an exemplary embodiment of the present invention will be described. The optical power monitoring method according to the exemplary embodiment are the actions of the optical power monitoring device 10 of the exemplary embodiment considered as the invention of a method.

That is, the optical power monitoring method according to exemplary embodiment is used for the optical power monitoring device 10 which includes: the APD 11 as the photodiode which converts the received optical power P into the current Iapd; the resistor 12 connected in parallel to the APD 11; and the current mirror circuit 13 which detects the value corresponding to the sum of the current Irb flowing through the resistor 12 and the current Iapd flowing through the APD 11 as the first current value I1. Further, the optical power monitoring method according to the exemplary embodiment is a method which stores in advance the value corresponding to the current Irb flowing through the resistor 12 as the second current value I2 and acquires the current Iapd flowing through the APD 11 based on the second current value I2 and the first current value I1 detected by the current mirror circuit 13.

Further, in a case where the optical power monitoring device 10 further includes a temperature sensor 15 which detects the temperature T of the APD 11, the relation between the temperature T detected by the temperature sensor 15 and the second current value I2 may be stored in advance as a first relation (FIG. 2), the second current value I2 corresponding to the temperature T detected by the temperature sensor 15 may be acquired from the first relation (FIG. 2), and the current Iapd flowing through the APD 11 may be acquired by using the second current value I2.

Further, in a case where the optical power monitoring device 10 further includes the APD drive power source 16 as a power source which applies a voltage Vapd to the resistor 12 and the APD 11 and changes the voltage Vapd according to a control signal V1 from the outside, the relation between the temperature T detected by the temperature sensor 15 and the voltage Vapd applied to the APD 11 is stored in advance as a second relation (FIG. 3), the voltage Vapd corresponding to the temperature T detected by the temperature sensor 15 is acquired from the second relation (FIG. 3), and the control signal V1 is outputted to the APD drive power source 16 so as to output the voltage Vapd. At this time, in the first relation (FIG. 2), the change in the second current value I2 when the voltage Vapd is changed by corresponding to the temperature T detected by the temperature sensor 15 is added in advance.

The optical power monitoring method according to the exemplary embodiment can provide the same functions and effects as those of the optical power monitoring device 10 described above.

Next, an optical power monitoring program according to an exemplary embodiment of the present invention (referred to as "the program" hereinafter) will be described. The program is used for causing a computer to execute the actions of the control unit 14 of the optical power monitoring device 10 according to the exemplary embodiment.

The program is used for the above-described optical power monitoring device 10. The control unit 14 of the optical power monitoring device 10 is constituted with a computer having the MPU 141 and the memory 142. Further, the program causes the MPU 141 to achieve a function which inputs the second current value I2 stored in the memory 142 and the first current value I1 detected by the current mirror circuit 13 and a function which acquires the current Iapd flowing through the APD 11 based on the inputted second current value I2 and the first current value I1.

At this time, the MPU 141 may be structured to achieve a function which inputs the value of the temperature T detected by the temperature sensor 15 and the first relation (FIG. 2) stored in the memory, a function which acquires the second current value I2 corresponding to the inputted value of the temperature T from the inputted first relation (FIG. 2), and a function which acquires the current Iapd flowing through the APD 11 by using the acquired second current I2.

Further, the MPU 141 may be structured to achieve a function which inputs the value of the temperature T detected by the temperature sensor 15 and the second relation (FIG. 3) stored in the memory 142, a function which acquires the voltage Vapd corresponding to the inputted value of the temperature T from the inputted second relation (FIG. 3), and a function which outputs the control signal V1 to the APD drive power source 16 so as to output the acquired voltage Vapd. At this time, in the first relation (FIG. 2), the change in the second current value I2 when the voltage Vapd is changed by corresponding to the temperature T detected by the temperature sensor 15 is added in advance.

FIG. 5 is a flowchart showing an example of the actions of the computer achieved by the program. Hereinafter, explanations will be provided by referring to FIG. 1 to FIG. 5.

First, the first relation (FIG. 2) and the second relation (FIG. 3) are inputted from the memory 142 (step 101). Subsequently, the temperature T is inputted from the temperature sensor 15 and the first current value I1 is inputted from the AD converter 21 (step 102). Then, the second current value I2 is acquired from the temperature T and the first relation (FIG. 2) (step 103). That is, the second current value I2 stored in the memory 142 is inputted substantially through executing the steps 101 and 103. Subsequently, the current Iapd flowing through the APD 11 is acquired from the first current value I1 and the second current value I2 (step 104). Subsequently, the voltage Vapd applied to the APD 11 is acquired from the temperature T and the second relation (FIG. 3) (step 105). At last, the control signal V1 is outputted to the APD drive power source 16 so as to output the voltage Vapd (step 106).

Further, in a case where the processing is to be continued, the steps 102 to 106 are repeated. In this example, the steps 104 to 106 are executed after the steps 102 to 103. However, inversely, the steps 104 to 106 may be executed before the steps 102 to 103, or the steps 102 to 103 and the steps 104 to 106 may be executed in a mixed manner. With the program, the same functions and effects as those of the optical power monitoring device 10 described above can be achieved.

In such case, the program may be recorded on a non-transitory storage medium such as an optical disk, a semiconductor memory, or the like. In that case, the program is read out from the recording medium and executed by the computer.

While the present invention has been described above by referring to the specific embodiment shown in the drawings, the present invention is not limited only to the embodiment described above. Various changes and modifications occurred to those skilled in the art can be applied to the structures and details of the present invention. Further, it is to be noted that the present invention includes the structures acquired by properly and mutually combining a part of or a whole part of the structures of each of the above-described embodiments.

While a part of or a whole part of the embodiments can be summarized as follows as the new techniques, the present invention is not necessarily limited only to the followings structures (Supplementary Note 1)

An optical power monitoring device which includes:
    a photodiode which converts a received optical power to a current;
    a resistor connected in parallel to the photodiode;
    a current mirror circuit which detects a value corresponding to a sum of a current flowing through the resistor and a current flowing through the photodiode as a first current value; and
    a control unit which stores in advance a value corresponding to the current flowing through the resistor as a second current value, and acquires the current flowing through the photodiode based on the second current value and the first current value that is detected by the current mirror circuit.

(Supplementary Note 2)

The optical power monitoring device as depicted in Supplementary Note 1, which further includes a temperature sensor that detects temperature of the photodiode, wherein
    the control unit stores in advance a relation between the temperature detected by the temperature sensor and the second current value as a first relation, acquires the second current value corresponding to the temperature detected by the temperature sensor from the first relation, and acquires the current flowing through the photodiode by using the second current value.

(Supplementary Note 3)

The optical power monitoring device as depicted in Supplementary Note 2, which further includes a power source that applies a voltage to the resistor and the photodiode and changes the voltage according to a control signal from the control unit, wherein
    the control unit stores in advance a relation between the temperature detected by the temperature sensor and the voltage applied to the photodiode as a second relation, acquires the voltage corresponding to the temperature detected by the temperature sensor from the second relation, and outputs the control signal to the power source so as to output the voltage.

(Supplementary Note 3-1)

The optical power monitoring device as depicted in Supplementary Note 3, wherein, in the first relation, a change in the second current value when the voltage is changed by corresponding to the temperature detected by the temperature sensor is added.

(Supplementary Note 3-2)

The optical power monitoring device as depicted in any one of Supplementary Notes 1 to 3, wherein the photodiode is an APD.

(Supplementary Note 4)

An optical power monitoring method used in a device including a photodiode which converts a received optical power to a current, a resistor connected in parallel to the photodiode, and a current mirror circuit which detects a value corresponding to a sum of a current flowing through the resistor and a current flowing through the photodiode as a first current value, and the method includes:

storing in advance a value corresponding to the current flowing through the resistor as a second current value; and acquiring the current flowing through the photodiode based on the second current value and the first current value that is detected by the current mirror circuit (Supplementary Note 5)

The optical power monitoring method as depicted in Supplementary Note 4, wherein the device further includes a temperature sensor that detects temperature of the photodiode, and the method includes:

storing in advance a relation between the temperature detected by the temperature sensor and the second current value as a first relation; acquiring the second current value corresponding to the temperature detected by the temperature sensor from the first relation; and acquiring the current flowing through the photodiode by using the second current value.

(Supplementary Note 6)

The optical power monitoring method as depicted in Supplementary Note 5, wherein the device further includes a power source that applies a voltage to the resistor and the photodiode and changes the voltage according to a control signal from outside, and the method includes:

storing in advance a relation between the temperature detected by the temperature sensor and the voltage applied to the photodiode as a second relation, acquiring the voltage corresponding to the temperature detected by the temperature sensor from the second relation, and outputting the control signal to the power source so as to output the voltage.

(Supplementary Note 6-1)

The optical power monitoring method as depicted in Supplementary Note 6, wherein, in the first relation, a change in the second current value when the voltage is changed by corresponding to the temperature detected by the temperature sensor is added in advance.

(Supplementary Note 7)

An optical power monitoring program used in a device including a photodiode which converts a received optical power to a current, a resistor connected in parallel to the photodiode, a current mirror circuit which detects a value corresponding to a sum of a current flowing through the resistor and a current flowing through the photodiode as a first current value, a memory, and a microprocessor, wherein the memory stores in advance a value corresponding to the current flowing through the resistor as a second current value, and the program causes the microprocessor to execute:

a function which inputs the second current value stored in the memory and the first current value detected by the current mirror circuit; and a function which acquires the current flowing through the photodiode based on the inputted second current value and the first current value.

(Supplementary Note 8)

The optical power monitoring program as depicted in Supplementary Note 7, wherein the device further includes a temperature sensor which detects temperature of the photodiode, and the memory stores in advance a relation between the temperature detected by the temperature sensor and the second current value as a first relation, and the program causes the microprocessor to execute:

a function which inputs a value of the temperature detected by the temperature sensor and the first relation stored in the memory;

a function which acquires the second current value corresponding to the inputted value of the temperature from the inputted first relation; and a function which acquires the current flowing through the photodiode by using the acquired second current value.

(Supplementary Note 9)

The optical power monitoring program as depicted in Supplementary Note 8, wherein the device further includes a power source which applies a voltage to the resistor and the photodiode and changes the voltage according to a control signal from the microprocessor, and the memory stores in advance a relation between the temperature detected by the temperature sensor and the voltage applied to the photodiode as a second relation, and the program causes the microprocessor to execute:

a function which inputs the value of the temperature detected by the temperature sensor and the second relation stored in the memory;

a function which acquires the voltage corresponding to the inputted value of the temperature from the inputted second relation; and a function which outputs the control signal to the power source so as to output the acquired voltage.

(Supplementary Note 9-1)

The optical power monitoring program as depicted in Supplementary Note 9, wherein, in the first relation, a change in the second current value when the voltage is changed by corresponding to the temperature detected by the temperature sensor is added in advance.

This Application claims the Priority right based on Japanese Patent Application No. 2011-206783 filed on Sep. 22, 2011 and the disclosure thereof is hereby incorporated by reference in its entirety.

INDUSTRIAL APPLICABILITY

The present invention can be utilized for the technique for monitoring the optical power in the fields of the optical communications and the like.

REFERENCE NUMERALS

10 Optical power monitoring device
11 APD (photodiode)
12 Resistor
13 Current mirror circuit
131 Transistor
132 Transistor
14 Control unit
141 MPU
142 Memory
15 Temperature sensor
16 APD drive power source (power source)

17 TIA
18 Resistor
19 LIM
20 Current-voltage converter circuit
21 AD converter

What is claimed is:

1. An optical power monitoring device, comprising:
a photodiode which converts a received optical power to a current;
a resistor connected in parallel to the photodiode;
a current mirror circuit which detects a value corresponding to a sum of a current flowing through the resistor and a current flowing through the photodiode as a first current value; and
a control unit which stores in advance a value corresponding to the current flowing through the resistor as a second current value, and acquires the current flowing through the photodiode based on the second current value and the first current value that is detected by the current mirror circuit.

2. The optical power monitoring device as claimed in claim 1, further comprising a temperature sensor which detects temperature of the photodiode, wherein
the control unit stores in advance a relation between the temperature detected by the temperature sensor and the second current value as a first relation, acquires the second current value corresponding to the temperature detected by the temperature sensor from the first relation, and acquires the current flowing through the photodiode by using the second current value.

3. The optical power monitoring device as claimed in claim 2, further comprising a power source which applies a voltage to the resistor and the photodiode and changes the voltage according to a control signal from the control unit, wherein
the control unit stores in advance a relation between the temperature detected by the temperature sensor and the voltage applied to the photodiode as a second relation, acquires the voltage corresponding to the temperature detected by the temperature sensor from the second relation, and outputs the control signal to the power source so as to output the voltage.

4. An optical power monitoring method used in a device comprising a photodiode which converts a received optical power to a current, a resistor connected in parallel to the photodiode, and a current mirror circuit which detects a value corresponding to a sum of a current flowing through the resistor and a current flowing through the photodiode as a first current value, the method comprising:
storing in advance a value corresponding to the current flowing through the resistor as a second current value; and acquiring the current flowing through the photodiode based on the second current value and the first current value that is detected by the current mirror circuit.

5. The optical power monitoring method as claimed in claim 4, wherein the device further comprises a temperature sensor which detects temperature of the photodiode, the method comprising:
storing in advance a relation between the temperature detected by the temperature sensor and the second current value as a first relation; acquiring the second current value corresponding to the temperature detected by the temperature sensor from the first relation; and acquiring the current flowing through the photodiode by using the second current value.

6. The optical power monitoring method as claimed in claim 5, wherein the device further comprises a power source which applies a voltage to the resistor and the photodiode and changes the voltage according to a control signal from outside, the method comprising:
storing in advance a relation between the temperature detected by the temperature sensor and the voltage applied to the photodiode as a second relation, acquiring the voltage corresponding to the temperature detected by the temperature sensor from the second relation, and outputting the control signal to the power source so as to output the voltage.

7. A non-transitory computer readable recording medium storing an optical power monitoring program used in a device comprising a photodiode which converts a received optical power to a current, a resistor connected in parallel to the photodiode, a current mirror circuit which detects a value corresponding to a sum of a current flowing through the resistor and a current flowing through the photodiode as a first current value, a memory, and a microprocessor, wherein the memory stores in advance a value corresponding to the current flowing through the resistor as a second current value, the program causing the microprocessor to execute:
a function which inputs the second current value stored in the memory and the first current value detected by the current mirror circuit; and
a function which acquires the current flowing through the photodiode based on the inputted second current value and the first current value.

8. The non-transitory computer readable recording medium storing the optical power monitoring program as claimed in claim 7, wherein the device further comprises a temperature sensor which detects temperature of the photodiode, and the memory stores in advance a relation between the temperature detected by the temperature sensor and the second current value as a first relation, the program causing the microprocessor to execute:
a function which inputs a value of the temperature detected by the temperature sensor and the first relation stored in the memory;
a function which acquires the second current value corresponding to the inputted value of the temperature from the inputted first relation; and
a function which acquires the current flowing through the photodiode by using the acquired second current value.

9. The non-transitory computer readable recording medium storing the optical power monitoring program as claimed in claim 8, wherein the device further comprises a power source which applies a voltage to the resistor and the photodiode and changes the voltage according to a control signal from the microprocessor, and the memory stores in advance a relation between the temperature detected by the temperature sensor and the voltage applied to the photodiode as a second relation, the program causing the microprocessor to execute:
a function which inputs the value of the temperature detected by the temperature sensor and the second relation stored in the memory;
a function which acquires the voltage corresponding to the inputted value of the temperature from the inputted second relation; and
a function which outputs the control signal to the power source so as to output the acquired voltage.

10. An optical power monitoring device, comprising:
a photodiode which converts a received optical power to a current;
a resistor connected in parallel to the photodiode;

current mirror means for detecting a value corresponding to a sum of a current flowing through the resistor and a current flowing through the photodiode as a first current value; and control means for storing in advance a value corresponding to the current flowing through the resistor as a second current value, and acquiring the current flowing through the photodiode based on the second current value and the first current value that is detected by the current mirror means.

* * * * *